United States Patent [19]

Larsen et al.

[11] Patent Number: 4,922,452
[45] Date of Patent: May 1, 1990

[54] 10 GIGASAMPLE/SEC TWO-STAGE ANALOG STORAGE INTEGRATED CIRCUIT FOR TRANSIENT DIGITIZING AND IMAGING OSCILLOGRAPHY

[75] Inventors: Raymond S. Larsen, Menlo Park; James T. Walker, Palo Alto, both of Calif.

[73] Assignee: Analytek, Ltd., Cupertino, Calif.

[21] Appl. No.: 120,669

[22] Filed: Nov. 16, 1987

[51] Int. Cl.[5] .......................................... G11C 27/00
[52] U.S. Cl. ...................................... 365/45; 365/149; 365/194; 365/230.03
[58] Field of Search ................. 365/45, 233, 149, 194, 365/230.03

[56] References Cited

U.S. PATENT DOCUMENTS

| | | | |
|---|---|---|---|
| 4,593,381 | 6/1986 | Shapiro et al. | 365/45 X |
| 4,635,116 | 1/1987 | Hirutu et al. | 365/45 |
| 4,648,072 | 3/1987 | Hayes et al. | 365/45 X |

Primary Examiner—A. J. Heinz
Assistant Examiner—Alfonso Garcia
Attorney, Agent, or Firm—Flehr, Hohbach, Test, Albritton & Herbert

[57] ABSTRACT

An analog integrated circuit is disclosed using integrated field effect transistor technology comprising a plurality of sampling and storage cells. A two-stage sampling cell design is used. The first stage incorporates a very small capacitor coupled to the input signal through a high speed gate. This gate, which is opened only by the simultaneous occurrence of row and column cells in the circuit, causes this first capacitor to capture at very high speed a sample of the analog signal under study. When all the first capture sections of the cell have captured on their capacitors a sample of the analog signal, a transfer gate is briefly opened to transfer the captured and buffered sample values to the second or storage section of the cells. This storage section incorporates a capacitor substantially larger than the capacitor in the capture section, and capable of storing the signal for a considerably longer time.

18 Claims, 5 Drawing Sheets

10 GIGASAMPLE/SEC TWO-STAGE ANALOG STORAGE INTEGRATED CIRCUIT FOR TRANSIENT DIGITIZING AND IMAGING OSCILLOGRAPHY

CROSS REFERENCE TO RELATED APPLICATIONS

A high speed analog signal sampling circuit is shown in U.S. application Ser. No. 595,790 filed Apr. 2, 1984, now U.S. Pat. No. 4,811,285, incorporated herein by reference by two of the inventors named herein.

BACKGROUND OF THE INVENTION

This invention is directed generally to an analog storage device and more particularly to a device for very high speed sampling of analog pulse information.

There is a great need to extend the range of measurement capabilities of high speed, very short lived electrical phenomena. Such measurements are particularly important in the growing fields of laser communications research, laser fusion energy research, nuclear research, weapons study, and high speed imaging. Other possible applications include biological research, materials research, and accelerator and high energy physics research. Transient digitizing techniques are already in use in most of these areas. However, in known systems, the accuracy degrades significantly with increases in transient speed of the signal to be sampled.

Prior efforts in this field have been limited by the fact that the storage capacitor for storing the signal sample must be kept extremely small, rendering it highly susceptible to leakage which degrades the accuracy of the sample. Moreover, because of the small size of the capacitor, the sample can only be held for a very short time.

A further limitation of known systems in the field is that they are not adaptable to simultaneous reading of a plurality of simultaneously occurring signals.

Current known methods are limited to sampling speeds of about 100 MHz with accuracies of 6–8 bits. These devices, known as flash analog-to-digital converters (ADCs), are expensive, consume high power, and require high speed, high power and expensive memories for data storage. Dual range techniques to increase the accuracy beyond eight bits become approximately twice as expensive.

SUMMARY OF THE INVENTION

It is an objective of this invention to provide a system capable of significantly improved sampling of fast pulse signals in a frequency range and at a sampling speed useful in laser and nuclear research and development, communications, imaging and other purposes.

A further objective herein is to provide reduced per-channel costs in high speed sampling applications, especially where multiple channels must be simultaneously sampled.

It is a further objective to provide improved density and power consumption in an ultra-high speed sampling circuit, making feasible very large multi-channel arrays.

More particularly, an objective herein is to provide a sampling speed increase over current pulse sampling circuit technologies of approximately 100 times (two orders of magnitude) for short duration pulse events.

A further objective herein is to provide a signal sampling device capable of a band width of greater than one GHz at 3 db rolloff.

Another objective herein is to provide an amplitude accuracy improvement over current flash ADCs of 1½ orders of magnitude for the basic device (10 bits compared with six bits; 0.1% cf 1.5% for full scale).

A further and related objective herein is to provide a high speed sampling device which consumes low power and has a relatively low cost per channel.

A further objective herein is to provide an integrated circuit device having an effective and efficient multiple channel capability for being adapted to two- or three-dimensional sampling arrays.

A further objective herein is to provide a high speed digitizing circuit that can be easily reconfigured for longer storage time intervals, and which further includes a reprogrammable sampling rate for adaptation to a wide range of signal frequencies.

The reconfigurable high density and low cost features of this invention allow the device to be adapted for such applications as recording of single transient phenomena for extended periods of time; generation of a stored oscilloscope display; computer storage of hundreds or thousands of channels of related or independent data; or generation of high speed, high resolution graphics or related picture storage systems with aperture times of approximately 0.1 nanoseconds per photograph and picture rates of $10^{10}$ per second.

In this invention, it has been recognized that a large and extremely important class of events require only that these extremely fast phenomena be observed for a short period of time. This favorable duty cycle lends itself to the invention to be described. Some circumstances will require the observation of many such signals simultaneously, or of certain signals over a more extended period of time. Again, the invention to be described can be configured to address these special requirements.

In summary, the invention comprises an analog integrated circuit using integrated field effect transistor technology comprising a plurality of sampling and storage cells. To achieve the high speed performance required, a two-stage sampling cell design is used. The first stage incorporates a very small capacitor coupled to the input signal through a high speed gate. This gate, which is opened only by the simultaneous occurrence of row and column cells in the circuit, causes this first capacitor to capture at very high speed a sample of the analog signal under study. When all the first capture sections of the cell have captured on their capacitors a sample of the analog signal, a transfer gate is briefly opened to transfer the captured and buffered sample values to the second or storage section of the cells. This storage section incorporates a capacitor substantially larger than the capacitor in the capture section, and capable of storing the signal for a considerably longer time.

The storage sections are read out in a multiplexed fashion through an output buffer comprising a pair of matched transistors feeding an analog output amplifier. The output amplifier is designed to provide voltage feedback to one of the two matched transistors of the output buffer so that non-linearities are removed from the signal representing the actual output which is read by the transistor from the storage capacitor; meanwhile, the nondestructive readout format is maintained. Further, by use of the separate output buffer in combination with a staged storage section, the read-in and read-out modes of the cell are separated, and could function simultaneously if desired.

The cells are assembled on integrated circuit chips comprising in a preferred embodiment 1024 (32×32) storage cells. A further novel feature herein is that various arrangements of the inputs can be made to extend the captured record length, both horizontally in terms of the number of channels being sampled, and vertically in terms of the length of the record. Because of the extremely low input capacitance of a given column of cells, it is practical to combine cell groupings either vertically to add additional devices, or horizontally to columns of devices, to achieve sampling groupings that are extremely flexible and can be more easily tailored to a particular application. This flexibility is of paramount importance in certain applications where many thousands of parallel data channels must be instrumented. The high speed timing required to allow the coupling of different portions of the same signal to a single channel or adjacent channels is achieved either through the use of delay lines, the delay lines being used to delay the input of the analog signal being sampled to the next adjacent channel; or by application of a gating signal to the capture section of a cell via a high-speed parallel output shift register, or equivalent timing technique.

BRIEF DESCRIPTION OF THE DRAWINGS

The details and advantages of this invention will become apparent to a person of skill in the art who studies the following description of a preferred embodiment given in conjunction with the following figures, which comprise.

DETAILED DESCRIPTION OF A PREFERRED EMBODIMENT

Figure 1:
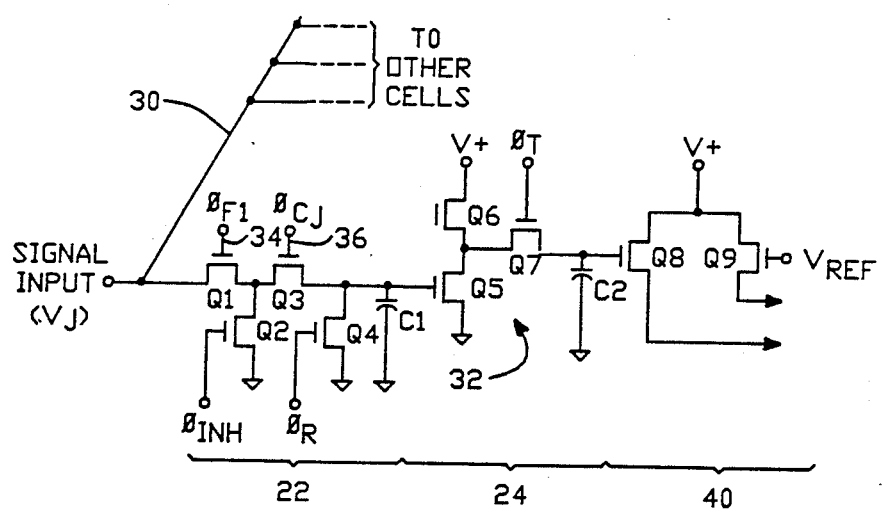
FIG. 1 is a detailed schematic view of the two-stage sampler and output buffer design.

The two-stage cell design 20 used to sample an analog signal input $V_j$ is shown in schematic form in FIG. 1. This sampling cell 20, which includes first and second stages comprising a capture stage 22 and a storage stage 24 optimizes the speed of sampling. The goal of the sampling design is to achieve a circuit input band width of greater than 1 GHz, and sampling speeds of up to 10 GHz (10 gigasamples/sec, or GS/s). The speed of the basic circuit implementation to be described is limited only by the input-following time constant which defines the bandwidth, and by the external fast timing circuitry (which will be described with respect to FIG. 5) which must generate clean signals of 1 nanosecond transition time for optimum performance at a 1 GS/s rate in the current implementation.

The principle of operation of the basic sampling cell is as follows: the analog SIGNAL IN ($V_j$ shown also at the top line of FIG. 2) is applied to the input of the sampling cells 20 through a common analog bus 30 on the integrated circuit chip that will carry a large number of the cells, typically 1024 per chip. The typical single sampling cell 20 comprises two stages. The first, called the signal capture section 22, includes essentially a pair of FET gates Q1, Q3 followed by a small sampling capacitor C1. This capacitor C1 has an extremely small value, and may essentially comprise only the stray capacitance of the input circuit. The reason for the use of this very low value capacitance is to reduce the input capacitance of the sampling cell 20, maximizing the speed of sampling and the number of cells that may be connected to the common bus 30. For optimum bandwidth, the voltage following RC time constant must be very short; therefore, a preferred embodiment of the design for capacitor C1 minimizes the value to approximately 0.1 picofarads, so that the RC time constant becomes approximately 100 picoseconds, leading to an input bandwidth of 1.6 GHz.

Figure 2:
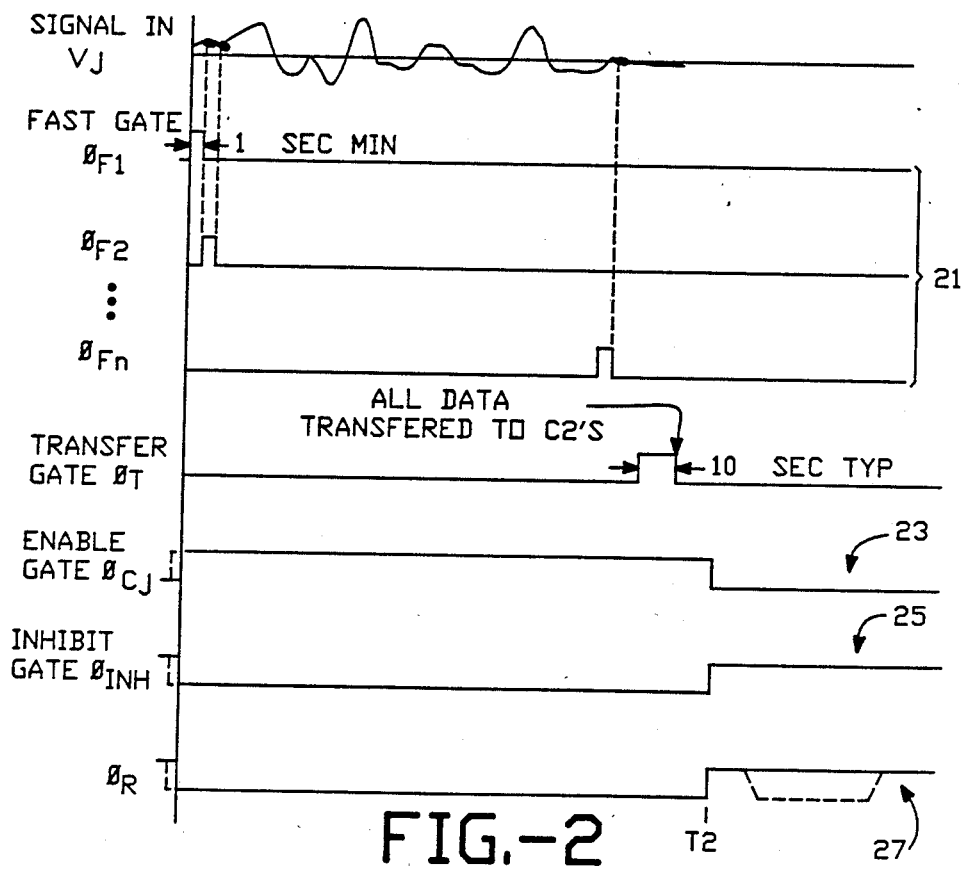
FIG. 2 is a timing diagram illustrating the signal to be sampled and the timing signals needed to sample this input signal.

The storage capacitor C1 is buffered by a voltage follower circuit 32 comprising a pair of FETs Q5 and Q6. In an alternative embodiment, the buffer circuit 32 may be replaced with a stage providing voltage gain. Each sampling cell 20 is activated by the coincident occurrence of a pair of signals $\phi F_i$ and $\phi C_j$ (FIG. 2, lines 21, 23), applied to gates 34, 36 of the pair of transistors Q1 and Q3. Typically, the column signal $\phi C_j$ remains on for the entire time a column of cells is to be enabled. The fast gate control signals applied to the gate 34 of transistor Q1 are generated off chip (preferably using the circuit of FIG. 5) and cause the storing of a value of a particular voltage taken from the analog signal $V_j$ at the occurrence of the trailing edge of the storage gate waveform $\phi F_i$. The capture section 22 includes two further transistors Q2 and Q4, whose functions contribute to the accuracy of this capture stage 22, and the accuracy of transfer of the captured sample to the next succeeding storage stage 24. Transistor Q2, coupled between the junction of transistors Q1 and Q3 and controlled by signal INH (FIG. 2, line 25), cooperates with transistor Q1 to form a filter against unwanted signal feed through during read-out of the data. Low frequency noise signals will be attenuated in the ratio of $R_{2on}/R_{1off}$, and high frequency feed through will be limited by the attenuation factor of $Z_{2on}/jX1_{off}$, where X1 is primarily the reactance of the stray capacitance from the input to the junction of Q1 and Q3. Transistor Q4 is coupled between the junction of transistor Q3 and capacitor C1, and ground, its state being controlled by the signal $\phi R$ (FIG. 2, line 27). As appears at the bottom of FIG. 2, the state of signal $\phi R$ is changed to ground capacitor C1, discharging it completely. Transistor Q4, together with transistor Q3, thus forms a second filter to isolate noise from reading the sample on C2.

In summary, samples of the SIGNAL IN $V_j$ are taken at the trailing edge of each fast gate signal $\phi F_i$ applied to the gate of transistor Q1 and stored on capacitor C1. Since capacitor C1 is very small, its hold time is limited to very short times of the order of a few hundred microseconds. Therefore, the sample cell 20 of this invention comprises a second stage or storage section 24 immediately following the first stage comprising gate Q7 activated by a signal $\phi T$ and a larger storage capacitor C2 which has a value of approximately 1 picofarad. This storage section 24 provides a storage time for the sample cell 20 of hundreds of milliseconds. It can be seen from FIG. 2 that the transfer gate, comprising transistor Q7, is enabled by the signal $\phi T$ at a time following the fast gate signal $\phi F_i$ to the transistor Q1 of the last sampling cell 20 of an array. This way, all the data or analog samples stored on the capacitor C1 of every cell 20 are transferred simultaneously to the storage stages 24 and specifically the capacitors C2. It is a feature of this invention that at the time T2 (FIG. 2, line 27) when the data are transferred from the capture section 22 to the storage section 24, another fast write cycle can immediately commence even while the original data is not yet read out or is being read out via the multiplexed read lines 42, 44. Thus, a double shot fast capture mode is possible, so long as the first data sample transferred to the storage stage capacitor C2 is read out rapidly enough that the dynamically stored data that is stored in the second round of data samples on the capture stage capacitor C1 does not significantly deteriorate before transfer of the second sample into the second stage storage capacitors C2.

The storage time extension provided by the storage stage 24 is particularly important in typical implementations where large arrays of cells are to be read out over a common analog bus as will be discussed with respect to FIG. 10. Capacitor C2 of the storage stage 24 is followed by an output buffer stage 40 comprising a transistor Q8 operating in conjunction with a reference cell Q9 to provide a differential analog read-out signal consisting of the sampled voltage and the reference voltage impressed upon differential analog output buses 42, 44. This operation will be explained in greater detail below.

Figure 3:
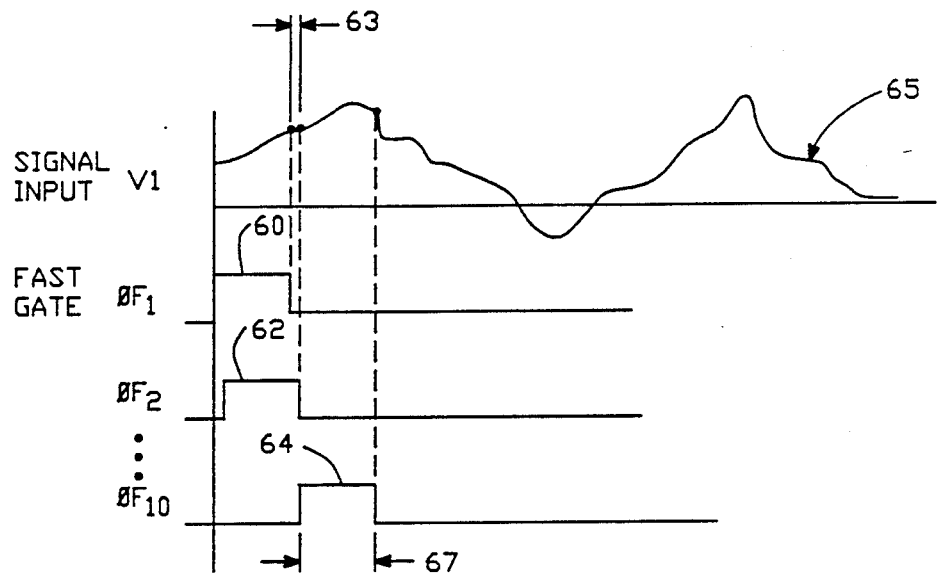
FIG. 3 illustrates an alternative array of timing signals usable with the embodiment of FIG. 1 to sample the analog input signal.

A further important feature of the design of the sampling cell of FIG. 1 is its adaptability to control by the overlapping timing pulses shown for example in FIG. 3. As discussed above, the gate of transistor Q1 which controls the sampling of the analog signal $V_j$ causes the sample to be taken upon the occurrence of the trailing edge of the control signal $\phi F_j$ at gate 34. Because of this and the further fact that the length of time for which the steady state of the signal $\phi F_i$ to any gate 34 may exist is not relevant to the sample time, a series of overlapping timing signals such as those shown in FIG. 3 and labelled 60, 62, 64 may be applied to the gates of the transistors Q1 of a plurality of separate cells that are receiving the same input signal V1, 65. It can be seen in FIG. 3 that signals 60, 62, 64 themselves overlap, but that the trailing edges thereof are separated by perhaps 100 picoseconds. Thus in the example shown in FIG. 3, 10 adjacent cells at once could be turned on and actively tracking and sampling the input voltage waveform. The actual samples would be taken at the trailing edges of the control signals 60-64, which edges can be very closely spaced in time. Because of the very small capacitance of the capture stage capacitor C1, the input is loaded only very slightly more than it would be normally. In contrast, normally the input capacitance to a large collection of cells would be very large compared with the input capacitance of a single cell. This advantage is achieved in part because each capture stage 22 of this cell design 20 is isolated by the input FET gate Q1, so that the input capacitance is limited to being essentially the capacitance of the channel of the FET Q1 itself.

Figure 4:
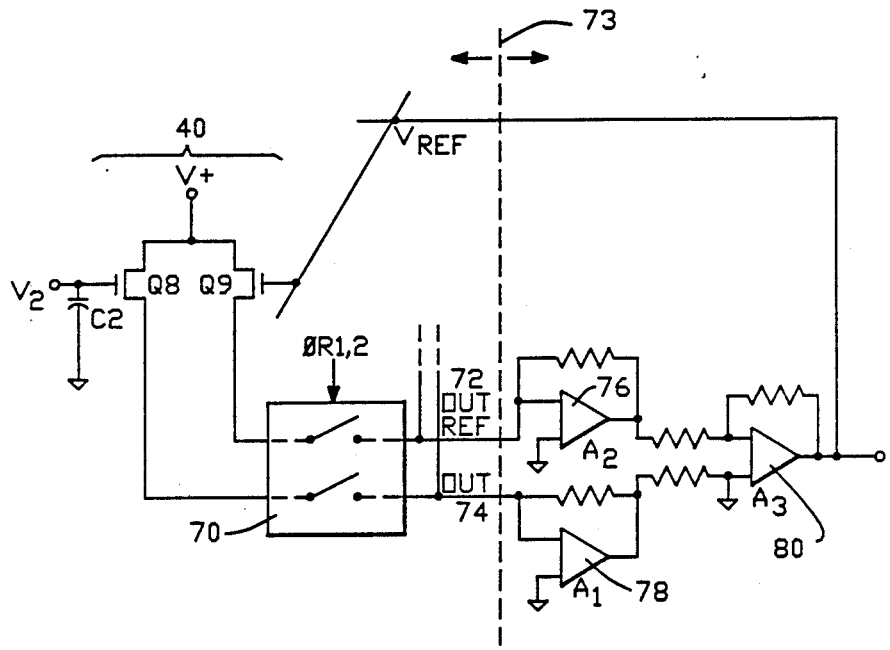
FIG. 4 is a schematic diagram of the output buffer and output amplifier scheme used to linearize the output data of the sampling cell.

Turning to FIG. 4, the differential read-out scheme of this invention is shown in detail therein. To read out the voltage stored in any sampling cell 20, the particular cell is selected by the multiplexing gate 70 in a manner already known in this technology and described for example in U.S. application Ser. No. 595,790, filed Apr. 2, 1984, and incorporated herein by reference.

The multiplexed differential output signals 72, 74 are fed through a pair of operational amplifiers 76, 78 into a voltage sensitive high gain operational amplifier 80. The output of this amplifier 80 is read as the output signal $V_{OUT}$ of the sampling cell and is applied as a feedback signal $V_{REF}$ to the gate of transistor Q9 through a filter section (not shown). By this feedback action, the current difference between transistor Q8 (which provides the actual stored sample from storage section 24) and transistor Q9 (which comprises the reference transistor) is minimized or nulled to a fraction of the sampled voltage, that fraction being defined by the ratio of the closed loop to the open loop gain as in any known feedback circuit. The transistors Q8 and Q9 are of matched monolithic construction to minimize differences between the reference signal 72 and output sample 74. The amplifier 80 is a high gain amplifier that can be adjusted to minimize the error in matching the currents from Q8 and Q9. The result of this is that a linear transfer is provided from the capacitor C2 to the voltage output $V_{REF}$, with any non-linearities in the operating characteristic curve of the transistors being divided by the forward gain of the amplifier to reduce their significance.

By providing the operational amplifiers 76, 78, and 80, between the output buffer and the signal output, and feeding output signal VREF back to the matched transistor Q9, the voltage that appears at the gate of the FET buffer transistor Q9 will be identical to the voltage residing on the sampling capacitor C2, attached to the gate of FET buffer transistor Q8. Transistors Q8 and Q9 are identical in structure and very closely coupled physically as are the subsequent differential pairs of transistors incorporated in the multiplexing read-out buses. Therefore, the disclosed design will provide a close tracking between the output voltage $V_{OUT}$ of the circuit which is now the reference voltage $V_{REF}$, and the sampled signal voltage, to a first order. This unique read-out method removes the need for first order linearization of the data to compensate for the inherent nonlinearities in non-fed-back circuits Correction of sampled data for other effects, such as timing and threshold variations in the cells, which are second order effects important only at the highest frequency of operation, can still be applied by external calibration correction means that will be described later. For many applications, the simple linearization provided by the operational amplifier feedback scheme of this invention will be sufficient.

Figure 5:
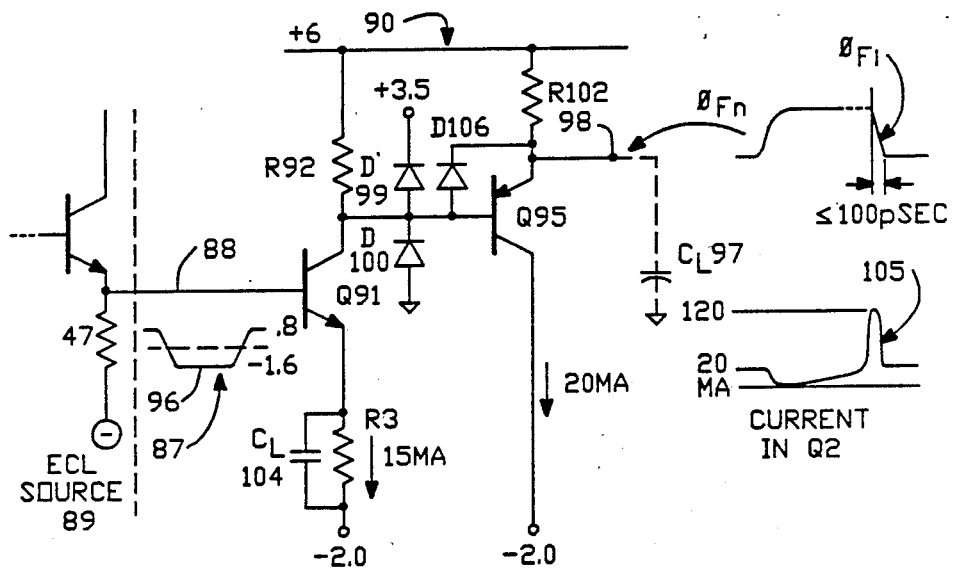
FIG. 5 is a schematic diagram of a driver circuit used to drive one of the control gates of the capture section and having an extremely rapidly falling trailing edge for controlling the gate.

Returning to the sample cell 20, and specifically the capture section 22, the driver circuit shown in FIG. 5 for providing the fast gate pulses $\phi F1$ to the gate of transistor Q1 will next be discussed. The aperture, or turnoff time of this first stage of the sampler circuit is critical. The transistor Q1 used to provide this gate is a minimum geometry device to optimize its speed of operation. The sample time of cell 20 is a direct function of the falling edge time of the signal $\phi F_i$ shown at the upper right of FIG. 5 which drives the transistor Q1 in FIG. 1. If this edge were infinitesimally short in time, the device would sample precisely the voltage stored on the capacitor at that time. At a sampling speed of 1 GHz, it is desirable to have a trailing edge time of 100 picoseconds or less.

In a typical implementation, groups of cells will be connected together in a column or row array to minimize the amount of fast drive circuitry that must be provided for the cell sample lines. However, this increases the capacitance of the load to be driven by the driver circuit. FIG. 5 shows a driver circuit capable of driving up to 32 cells with a signal $\phi F_i$ having a trailing or falling edge time of less than 100 picoseconds, although together, the cells have a calculated load capacitance of three picofarads. The design assumption for this circuit is that the rising edge of the $\phi F_i$ pulse does not need to be nearly as fast; but must be above a defined threshold a sufficient time for the signal to settle to the correct value on the 0.1 picofarad capture capacitor C1. In fact, the signal $\phi F_i$, and therefore the capture stage transistor Q1, could theoretically be turned on an arbitrarily long time ahead of the falling edge. In practice, a fast sampling pulse $\phi F_i$ of several nanoseconds is advantageous. In either case, the major requirement is to generate an extremely fast falling edge for the signal $\phi F$. A circuit that serves the purpose of providing the fast falling edge for the signal $\phi F_i$ is shown in FIG. 5. This circuit assumes that an input signal 87 comprising a 1 nanosecond wide pulse with rise and fall times of approximately 100 picoseconds and having an output value that varies between $-0.8$ volts and $-1.6$ volts is generated from a fast bipolar or gallium arsenide shift register, delay line, or an equally fast source, represented by the transistor and resistor combination labelled ECL source 89. The standard logic levels of emitter coupled logic (ECL) are assumed for the source. The driver circuit 90, which is to take the pulse 87 and shape it to provide the rise and especially the falling edge time required for signal $\phi F_i$ of cell 20 essentially comprises a common emitter current switch Q91, followed by a common collector stage Q95 which functions as a current multiplier. This current multiplier Q95 responds to a change in the level of the applied ECL signal 87 to produce a very high current output to very rapidly discharge the load capacitance CL 97 of the sample cell 20. In this way, when the output 98, which is coupled to the gate of transistor Q1, changes state and provides this high current output, an extremely fast falling edge of the signal $\phi F_i$ is produced to provide the less than 100 picosecond falling edge signal required. The requirement imposed on the driver circuit of FIG. 5 is to first charge the capacitor CL representing the gate circuits, and then to discharge it rapidly within the required fall time. Therefore, a PNP follower circuit is used incorporating the transistor Q95. The switch Q91 is designed for a standing current of 15 MA. Matching diodes D99 and D100 are provided to define the range of signal applied to the base of the transistor Q95. The circuit is designed to operate as follows: when the value of signal 87 on line 88 to the base of transistor Q91 is at $-0.8$ volts, a sufficient voltage drop exists across resistor R92 such that diode D100 will turn on, with its speed of turn-on depending on the size of R92. It has been determined that this resistor should be at least 400 ohms. At this time, the follower transistor Q95 will turn on, providing a logic zero at its emitter output. When the signal on line 88 goes to its value of $-1.6$ volts, the collector of the transistor Q91 will go positive, and the diode D99 will conduct, causing the base of transistor Q95 to go positive to about 4.3 volts. This will cause the output at the emitter of transistor Q95 to go positive, and charge the effective capacitance CL97 of the sample cell with a time constant in the up direction set by the values of the resistors R92 and R102. R102 is typically 300 ohms or less, assuming a capacitive load of three picofarads.

It is noted that this will lead to a standing current in transistors Q90 and Q95 of about 35 milliamps, and a combined power dissipation of 195 milliwatts for one stage or 6.4 watts for 32 stages. To reduce this power, the values of R1 and R2 can be increased, and a correspondingly longer charging time allowed. The values shown are quiescent nominal currents. The width of the clock pulses varied inversely with this nominal current.

At the critical time when the fast falling edge of $\phi F_i$ is to be produced, the signal on line 88 returns to its value of $-0.8$ volt. Both transistor Q91 and Q95 are configured to be able to draw maximum instantaneous current in the negative going direction at this time. Therefore, the fall time at the output of transistor Q95 is determined solely by the maximum instantaneous current and the load capacitance CL 97. To get added pull down current through the transistor Q95, a speed-up capacitor C104 is provided at the emitter of transistor Q91 to pull added charge into the base of transistor Q95. This current, when amplified, is available to aid in the discharge of the capacitor CL97 and provide an instantaneous change in the value of the current in Q95 as shown at curve 105 on the right of FIG. 5.

For transistors Q91 and Q95 to switch sufficiently rapidly, transistors with an Ft of at least 6 GHz must be provided; to discharge CL97 in less than 100 picoseconds requires an instantaneous current in the transistor Q91 of Cdv/dt=100 milliamps, a very reasonable value.

Diode D100 is to prevent transistor Q91 from saturating, and guarantees a stable low level voltage at the output of transistor Q95 at the zero voltage condition. Diode D99 prevents transistor Q95 from turning off, and sets the high level at the output of transistor Q95 to 4.3 volts. An additional diode D106 is provided across the base emitter junction of transistor Q95 to prevent potential damage to this transistor.

It should be noted that to prevent excess power dissipation in the circuit, it is an option to pulse the supply power ON just before commencement of the write cycle. In many applications, this is a perfectly acceptable mode of operation. Also, to increase the gate transition, and hence, improve the dynamic range, the supply power for the buffer section just described can be pulsed to a somewhat higher level ($+6$ volts) shown in FIG. 5.

The driver circuit described above is a clear improvement over known driver circuits in that the power dissipation is controllable by reducing standing current at the cost of charging the switching circuits more slowly. The maximum speed of the falling edge is preserved by virtue of the high current gain of both transistors Q91 and Q95 being used to drive the discharge of the capacitor CL97. With appropriate external control circuitry, having propagation delay relatively less than 100 picoseconds, groups of cells, e.g., columns, or entire chips can be phased to achieve an overall system sampling rate of up to 10 GS/sec.

Having described the organization and design of each cell, the remaining figures illustrate different forms of organization on a single chip of a plurality of groups of cells. In an exemplary embodiment shown in FIG. 5, the cells are arranged in a 32×32 array, with each column of 32 cells having a single voltage signal input $V_i$, the column signal $\phi_c$ being common to all the 32 cells in a given column. Each sample cell is activated only when both $\phi C_j$ and $\phi F_i$ are simultaneously high. By providing an arrangement as in FIG. 5, which may be provided on a single chip, 32 parallel input signals, V1 through V32, may be sampled simultaneously over the same fast timing interval, at speeds up to 1 sample every 100 picoseconds, or 10 GS/s. By virtue of the fact that the cells appear in a regular rectangular array with the column clock signals bussed vertically, and the fast row clock signals bussed horizontally, a number of different arrangements are available to sample an incoming signal or signals for different periods of time at very high speeds.

Figure 6:
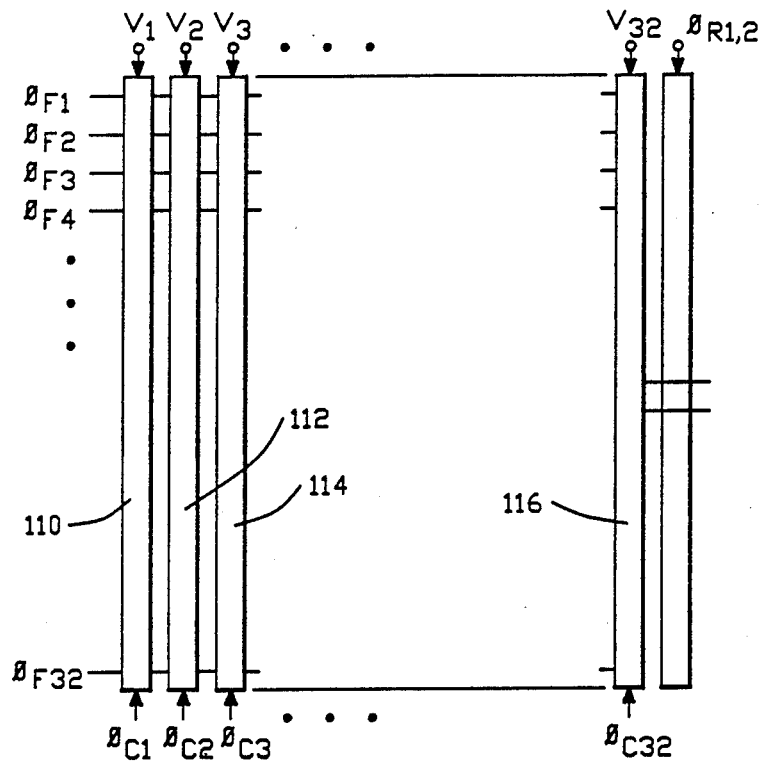
FIG. 6 illustrates the basic arrangement of a plurality of input cells arrayed in columns to sample a plurality of separate input signals.

An alternative arrangement for storing a long series of samples of a single input signal appears in FIG. 6, where all the signal inputs are tied in parallel. According to this arrangement, the column signals $\phi C_1$–$\phi C_{32}$ follow one after the other, each column signal lasting for the duration of all 32 fast clock signals $\phi F_i$. This arrangement will provide for 1024 successive high speed samples of a single analog signal input V1.

Figure 7:
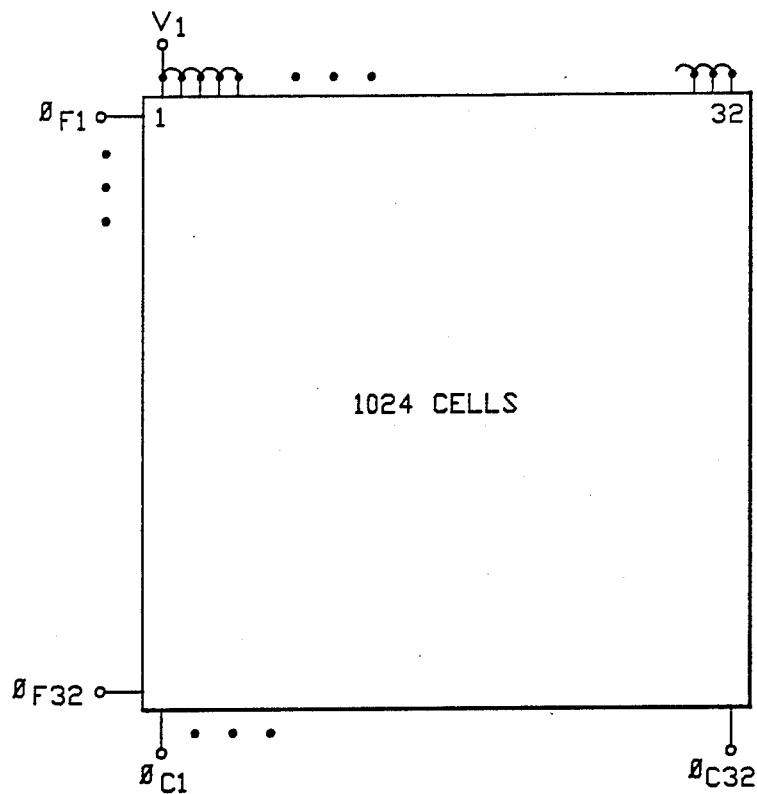
FIG. 7 illustrates an alternative to FIG. 6 in which the array of 1024 cells may be used to sample a single input signal V1.

Another arrangement is shown in FIG. 7. By connecting a plurality of column input lines together and then specifically addressing each column for the duration of the fast row gate signals $\phi F$ 1–32, a record of a length of the input signal V1N can be made where the number of successive samples equals the number of fast pulses $\phi F_i$ times the number of tied column inputs. In FIG. 6, the total cell array is divided into four segments 120, 122, 124, 126, each of which includes 256 cells and receives a single signal input V1–V4. Considering only the 256 cell matrix 120, by appropriate sequencing of the activating column clock signal $\phi C$, each column clock being held on for a period long enough to allow all 32 fast clock signals $\phi F$ to occur, a total of 256 successive samples can be taken of a single input signal V1.

Figure 8:
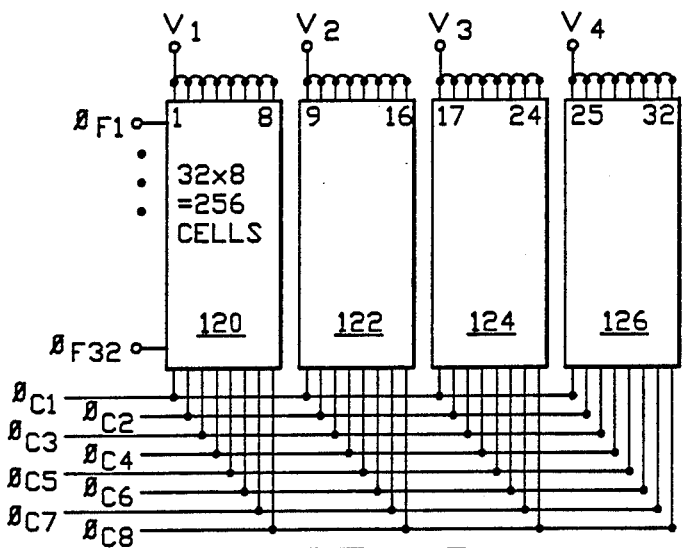
FIG. 8 illustrates an alternative arrangement in which an entire integrated chip of 1024 cells is used to sample four input signals V1-V4.

An alternative method of using the structural scheme of this invention to take extremely closely spaced samples of a given input signal appears in FIG. 8, with two alternatives being illustrated in the same figure. In the first alternative, two successive columns of cells 130, 132 have their V1N signal inputs connected by a delay line 134. When the signal V1 occurs, it first appears at the input V1 to the column 130, and a very short time later established by the delay line 134 at the input V2 to the column 132. If the column clock signals $\phi C1$ and $\phi C2$ are both present and the fast clock capture signal $\phi F_i$ now occurs, the first cell of column 130 captures a sample of the analog signal at its input, and the first cell in column 132 captures a sample of the same signal as it occurred a short time interval later. The time interval is fixed by the delay of delay line 134.

An alternative, rather than using the delay line 134 at the signal input, would be to use a delay line 136 of the same time delay coupling the column clock inputs 138, 140. In this instance, the column clock $\phi C1$ at the first column 130 would go high at a certain point and when it coincides with the existence of signal $\phi F1$ would store a sample of the input signal V1. The column clock C2 goes high a period of time later such that it would store a sample of a signal in the first cell of the column 132 at the time of its coincidence with a signal $\phi F1$, which signal is constantly repeating. This arrangement would be especially useful with slower sampling rates.

For example, returning again to the example of a delay line coupling two inputs, assume that the inputs V1, V2 are connected through a one nanosecond delay line 134, and similarly in the array shown in FIG. 7, that input pairs 3-4, 5-6, etc., to 31-32 are each connected through a one nanosecond delay line and that the basic clock driving speed through lines $\phi F1$-32 is reduced to two nanoseconds per cycle (500 MHz). Then the resulting stored record will contained 16 channels of data, each with 64 stored values, each data point representing a sample taken at a one nanosecond interval on each of the 16 channels. In this arrangement, it should be noted that the samples are all taken at precisely the same time on all channels, which is an important feature in certain classes of measurements where it is necessary to correlate the time measurements on many points simultaneously.

Figure 9:
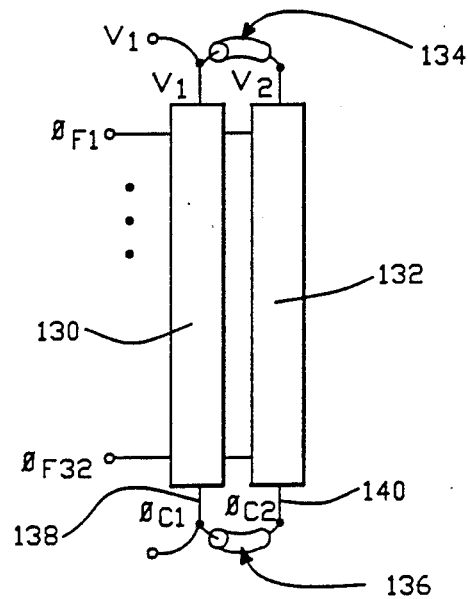
FIG. 9 illustrates an arrangement incorporating alternative uses of delay lines to delay application of the input signal or the clock signal to columns of cells in order to simplify the generation of timing signals.

A further novel extension of this design is that each integrated chip of 1024 cells may be replicated and interconnected in an array of like chips, to extend the record length both horizontally in number of channels and vertically in length of the record to be made of any given input signal. This could be done as shown in FIG. 9 by coupling either the signal inputs V1 in the vertically arrayed chips 140, 142, 144 using delay lines 146, 148, the delay lines being equal to the time necessary to produce all fast 32 pulses $\phi F1$-$\phi F32$; or by connecting the respective fast control lines $\phi F$ for each chip through delay lines 150, 152. In this way, the signal input V1 could travel through the length of the vertical chip array 140–144, with all of the cells then being pulsed at appropriate time intervals by the appropriately delayed $\phi F_i$ signals. This arrangement is available since the input capacitance of a given column of cells as designed herein is extremely small, on the order of one picofarad for 32 cells. It is therefore practical to combine the cell groupings either vertically, to additional devices, or horizontally for example via delay lines. Sampling groupings are thereby provided which are extremely flexible and can be more easily tailored to the particular application. This flexibility is of paramount importance in certain applications where many thousands of parallel data channels must be instrumented. The 32 column device described herein, used with delay lines can yield combinations limited only by the practicability of implementing such delay lines. In principle, a single chip can be configured as 32 analog data channels, or as any combination of columns connected together to analyze any number of inputs between 1 and 32.

Another important feature herein is that 10-GS/s equivalent sampling speed can also be achieved by delaying the fast clock lines $\phi F1$-$\phi F32$ in the arrangement in FIG. 9 from one chip to the next in the vertical direction 140-144 by 100 picoseconds, and using for example M=10 chips. Thus the gate signals for chip M=2 will be uniformly delayed from chip M=1 by 100 picoseconds; from M1 to M3 by 200 picoseconds, and so on. Thus, one full cycle of the fast clocks from $\phi F1-\phi F32$ will store the data for 10 100-picosecond intervals in each of 10 chips. On read-out, the readout sequence can be trivially arranged to match the write sequence, such that a continuous record of samples in the natural time sequence will be received at the read output. Moreover, the vertical columns of each chip can be organized, one with respect to the other, such that total record length and number of channels can be configured to suit the particular application.

Figure 10:
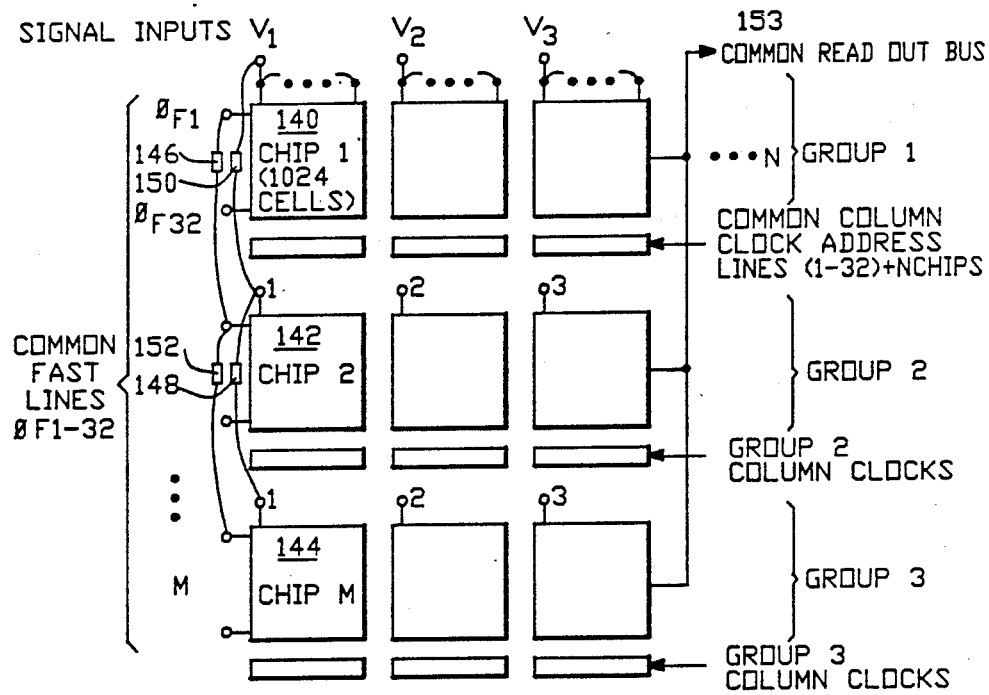
FIG. 10 illustrates an alternative arrangement incorporating a plurality of integrated circuit chips each comprising 1024 cells, the data or clock signals being delayed by appropriately connected delay lines or similar delay device to capture a sequence of samples of an analog signal over an extended period of time.

In a preferred embodiment, each chip 140 comprises 1024 sample cells of the design shown in FIG. 1, and includes a driver circuit such as shown in FIG. 10 for each set of 32 sample cells, all combined on a hybrid circuit. This combination is recommended for optimum timing performance. A common readout 153 and common clock address lines 155 ($-32 \times 17$ chips) is also provided.

The basic difference between the approach described with respect to FIG 9 for achieving 10-GS/s performance vs. the overlapping pulse method described in FIG. 3 is that in the FIG. 9 example it is not necessary in principle to overlap write pulses to achieve the result. At the same time, the assumption is that a longer record length or more parallel data channels justify the use of 10 chips.

A further alternative embodiment of this invention is achieved by extension of the basic configuration shown in FIG. 9. A system for continuous recording of single or multiple data channels can thereby be achieved of sampling speeds up to 10 GS/s. This requires organizing the read outputs into n groups of ADCs, such that the assemblage of converters runs at an overall speed equivalent to n times the speed of a single converter. Suppose converters of 10 MHz are used, and an overall sampling speed of 1000 MHz or 1 GHZ is required. This can be achieved with 100 groups of sampler chips followed by a converter. A continuous recording speed of 10,000 MHz would require 1000 converters. The storage capacity of a single group would normally be kept to the minimum needed to accomplish the desired maximum speed of sampling. This arrangement can be achieved due to the fact that sampling of continuous waveforms at the maximum rates of the sampler chip is always feasible and practical. Further, a wide dynamic range achievable by no other system is achieved by this invention. Finally, the digital memory requirements are simple since relatively slow speed, low power memories can be used instead of ultrafast memories which ultimately limit the performance of flash systems known in the prior art.

Other alternatives may become apparent to a person of skill in the art who studies this invention disclosure. Therefore, the scope of this invention is to be limited only by the following claims.

What is claimed:

1. A high speed data acquisition system for storing a succession of sampled values of an analog signal comprising analog signal input means and analog signal output means, a first analog bus connected to said input means and a second analog bus connected to said output means, a storage array comprising a plurality of cells arranged in rows and columns, row clock means coupled to said array for selectively activating each row of said array, column clock means coupled to said array for selectively activating each column of said array, said analog signal being directly coupled to said array to supplying said signal to the cells of said array, each of said cells comprising a first, capture section responsive to said row and column clock means for capturing one of said sample values at high speed, a storage section for holding said captured sample value for a relatively longer period than said capture section, an output buffer for transferring said captured sample to said analog signal output means, and transfer means for transferring said captured sample from said capture section to said storage section, whereby a very high speed sample of said analog signal may be taken by said capture section, said sample thereafter being transferred to said storage section.

2. A data acquisition system as in claim 1 wherein each of said capture sections and said storage sections includes a capacitor, said capture section capacitor being of a minimum value minimizing the capacitive load on said analog signal input is minimized, and maximizing bandwidth is maximized.

3. A data acquisition system as in claim 1 including means for periodically generating a transfer signal following the generation of row and column signals to a plurality of said cells, said transfer signal being simultaneously coupled to said transfer means of said plurality of said cells for transferring said captured samples to said storage section of said cells.

4. A data acquisition system as in claim 2 wherein said capture section capacitor is about 0.1 picofarad to achieve a signal bandwidth in excess of 1 GHz.

5. A data acquisition system as in claim 1 wherein said analog signal output means comprise a first buffer transistor coupled to the storage section capacitor for transferring the captured sample to the output, and a reference transistor cooperating with said buffer transistor to define a differential output signal to said outputs.

6. A data acquisition system as in claim 1 wherein said capture section comprises first and second transistors responsive to said row and column signals, respectively, to capture said samples of said analog signal, said first row signal responsive transistor being responsive to the trailing edge of said row signal to capture said sample, whereby the duration of each of said row signals is not determinative of the sample captured by said cell.

7. A data acquisition system as in claim 6 including timing means for generating said row and column signals, said row signals which are to be applied to successive cells in said array overlapping in duration and having closely spaced trailing edges, whereby a very rapid succession of samples of said analog signal may be taken.

8. A system as in claim 1 wherein a plurality of analog signal inputs to said columns of cells are tied in parallel to receive a single analog signal input whereby series of samples of a single analog signal equal to the total number of cells in the columns whose inputs are tied may be captured.

9. A system as in claim 1 including delay means connected between successive analog signal inputs of adjacent columns of said array, the same said row and column clock signals being applied to said adjacent columns whereby said adjacent columns store samples of said analog signal separated in time by the period of said delay line.

10. A data acquisition system as in claim 5 including a differential amplifier whose inputs are coupled to the outputs of said buffer transistor and said reference transistor, the output of said differential amplifier being the output signal to said analog output bus and being fed back to said reference transistor to minimize the difference in the outputs of said buffer and reference transistors, thereby reducing nonliniarities in the response of each cell in the array to less than ±1%, typically.

11. A system as in claim 6 wherein said columns are driven by a common set of devices, said inputs being connected to a plurality of sources to achieve simultaneous sampling of a relatively large number of analog signals provided by said different sources.

12. A system as in claim 1 realized in the form of a monolithic integrated circuit.

13. A system as in claim 7 wherein said columns are driven by a common set of devices, said inputs being connected to a plurality of sources to achieve simultaneous sampling of a relatively large number of analog signals provided by said different sources.

14. A data acquisition system as in claim 3 wherein said capture section comprises first and second transistors responsive to said row and column signals, respectively, to capture said samples of said analog signal, said first row signal responsive transistor being responsive to the trailing edge of said row signal to capture said sample, whereby the duration of each of said row signals is not determinative of the sample captured by said cell.

15. A data acquisition system as in claim 14 including timing means for generating said row and column signals, said row signals which are to be applied to successive cells in said array overlapping in duration and having closely spaced trailing edges, whereby a very rapid succession of samples of said analog signal may be taken.

16. A system as in claim 15 wherein said columns are driven by a common set of devices, said inputs being connected to a plurality of sources to achieve simultaneous sampling of a relatively large number of analog signals provided by said different sources.

17. A data acquisition system as in claim 16 including a differential amplifier whose inputs are coupled to the outputs of said buffer transistor and said reference transistor, the output of said differential amplifier being the output signal to said analog output bus and being fed back to said reference transistor to minimize the difference in the outputs of said buffer and reference transistors, thereby reducing nonliniarities in the response of each cell in the array to less than ±1%.

18. A data acquisition system as in claim 11 including a differential amplifier whose inputs are coupled to the outputs of said buffer transistor and said reference transistor, the output of said differential amplifier being the output signal to said analog output bus and being fed back to said reference transistor to minimize the difference in the outputs of said buffer and reference transistors, thereby reducing nonliniarities in the response of each cell in the array to less than ±1%.

* * * * *